(12) United States Patent
He et al.

(10) Patent No.: US 10,748,941 B2
(45) Date of Patent: Aug. 18, 2020

(54) LIGHT VALVE STRUCTURE, MANUFACTURING METHOD THEREFOR, OPERATING METHOD THEREFOR, ARRAY SUBSTRATE AND ELECTRONIC DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaolong He, Beijing (CN); Juan Chen, Beijing (CN); Yue Shi, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/106,502

(22) Filed: Aug. 21, 2018

(65) Prior Publication Data

US 2019/0244975 A1  Aug. 8, 2019

(30) Foreign Application Priority Data

Feb. 8, 2018 (CN) .......................... 2018 1 0128787

(51) Int. Cl.
*H01L 27/12* (2006.01)
*G02F 1/1362* (2006.01)
(Continued)

(52) U.S. Cl.
CPC .......... *H01L 27/124* (2013.01); *G02F 1/1368* (2013.01); *G02F 1/133345* (2013.01);
(Continued)

(58) Field of Classification Search
CPC ............. H01L 27/124; G02F 1/136209; G02F 2001/136218
See application file for complete search history.

(56) References Cited

U.S. PATENT DOCUMENTS 5,640,067 A * 6/1997 Yamauchi ............ G09G 3/3233
313/504
5,784,190 A 7/1998 Worley
(Continued)

FOREIGN PATENT DOCUMENTS

CN 102007441 A 4/2011
CN 107577041 A 1/2018
(Continued)

OTHER PUBLICATIONS

Chinese Office Action in Corresponding Patent Application No. 201810128787.8 dated Jun. 23, 2020. 11 pages.

*Primary Examiner* — Kyoung Lee
*Assistant Examiner* — Christina A Sylvia
(74) *Attorney, Agent, or Firm* — Leason Ellis LLP (57) ABSTRACT

A light valve structure, a manufacturing method therefor, an operating method therefor, an array substrate and an electronic device are provided. The light valve structure includes a base substrate, a light-transmissive part and a light-shielding part. The light-transmissive part is disposed on the base substrate and light-transmissive, and it at least includes a first electrode. The light-shielding part is disposed on the light-transmissive part; a first end of the light-shielding part is fixed relative to the light-transmissive part; and the light-shielding part includes a base layer and a second electrode layered on the base layer. The light-shielding part is configured to be curled so as to be away from the light-transmissive part, and/or the light-shielding part is configured to be spread due to the mutual adsorption (Continued)

between the first electrode and the second electrode, so as to be superimposed on the light-transmissive part.

18 Claims, 6 Drawing Sheets

(51) Int. Cl.
    *G02F 1/13357*     (2006.01)
    *G02F 1/1333*     (2006.01)
    *G02F 1/1343*     (2006.01)
    *G02F 1/1368*     (2006.01)

(52) U.S. Cl.
    CPC .. *G02F 1/133602* (2013.01); *G02F 1/134309* (2013.01); *G02F 1/136209* (2013.01); *G02F 1/136286* (2013.01); *G02F 2201/121* (2013.01); *H01L 27/1214* (2013.01)

(56) References Cited

U.S. PATENT DOCUMENTS

| | | |
|---|---|---|
| 2011/0170158 A1 | 7/2011 | Hong et al. |
| 2013/0188235 A1 | 7/2013 | Floyd et al. |
| 2014/0217411 A1* | 8/2014 | Jiang ............... H01L 27/124 257/59 |
| 2017/0170206 A1* | 6/2017 | Lee ............... H01L 27/1218 |

FOREIGN PATENT DOCUMENTS

| | | |
|---|---|---|
| JP | 09189870 A | 8/1996 |
| JP | 2010197778 A | 9/2010 |
| KR | 1020100122833 A | 11/2010 |

\* cited by examiner

LIGHT VALVE STRUCTURE, MANUFACTURING METHOD THEREFOR, OPERATING METHOD THEREFOR, ARRAY SUBSTRATE AND ELECTRONIC DEVICE

CROSS REFERENCE TO RELATED APPLICATIONS

The application claims priority to the Chinese patent application No. 201810128787.8, filed on Feb. 8, 2018 and entitled "Light Valve Structure, Manufacturing Method therefor, Operating Method therefor, Array Substrate and Electronic Device", which is incorporated herein by reference in its entirety.

TECHNICAL FIELD

Embodiments of the present disclosure relate to a light valve structure, a manufacturing method therefor, an operating method therefor, an array substrate and an electronic device.

BACKGROUND

A liquid crystal display (LCD) panel generally comprises an array substrate provided with thin-film transistors (TFTs), a filter substrate provided with filters, and a liquid crystal layer disposed between the array substrate and the filter substrate. In order to realize image display of the LCD panel, for instance, polarizers, of which the polarization directions are perpendicular to each other, usually need to be disposed on a light incident side of the array substrate and a light-emitting side of the filter substrate. The LCD panel comprises a plurality of subpixels arranged in an array, and the image display of each subpixel, for instance, may be controlled by a liquid crystal light valve. The deflection degree of liquid crystal molecules in a pixel is controlled by controlling the 'on' and 'off' of the TFT via voltage in each subpixel, so as to realize grayscale image display.

SUMMARY

At least one embodiment of the present disclosure provides a light valve structure, comprising; a base substrate; a light-transmissive part provided on the base substrate, in which the light-transmissive part at least includes a first electrode; and a light-shielding part provided on the light-transmissive part, in which a first end of the light-shielding part is fixed relative to the light-transmissive part, and the light-shielding part includes a base layer and a second electrode layered on the base layer; wherein the light-shielding part is configured to be curled so as to be away from the light-transmissive part; or the light-shielding part is configured to be spread due to the mutual adsorption between the first electrode and the second electrode, so as to be superimposed on the light-transmissive part.

For example, the light-transmissive part further comprises an insulating layer provided on a side of the first electrode away from the base substrate.

For example, a second end of the light-shielding part may be curled so as to be away from the light-transmissive part or be spread so as to be superimposed on the light-transmissive part.

For example, when the light-shielding part is superimposed on the light-transmissive part and is in the spread state, an orthographic projection of the base layer on the base substrate covers an orthographic projection of the second electrode on the base substrate.

For example, the base layer comprises non-transparent material, or the second electrode comprises non-transparent metallic material.

For example, the light valve structure further comprises a switching element, wherein the switching element is provided on the base substrate; and a first end of the second electrode is electrically connected with the switching element.

For example, the second electrode comprises an anchoring part so as to be fixed on the base substrate, the anchoring part being disposed at the first end of the second electrode and electrically connected with the switching element.

At least one embodiment of the present disclosure provides an array substrate, comprising the light valve structure.

For example, the array substrate further comprises a gate line, a data line, a common electrode line and a switching element. the first electrode is electrically connected with the common electrode line; the switching element comprises a control end, a first end and a second end; the gate line is electrically connected with a control end of the switching element; the data line is electrically connected with a first end of the switching element; the second electrode comprises an anchoring part, the anchoring part of the second electrode being electrically connected with the second end of the switching element.

At least one embodiment of the present disclosure provides an electronic device, comprising an array substrate, the array substrate comprising the light valve structure.

For example, the electronic device further comprises a backlight. The backlight is provided on a side of the base substrate provided with the light-transmissive part; or the backlight is provided on a side of the base substrate away from the light-transmissive part.

At least one embodiment of the present disclosure provides a method for manufacturing a light valve structure, comprising: forming a light-transmissive part comprising a first electrode; obtaining a light-shielding part by sequentially forming a base layer and a second electrode layered on the base substrate on the first electrode, in which a first end of the light-shielding part is fixed relative to the light-transmissive part; and curling the light-shielding part by heating, so as to be away from the light-transmissive part.

For example, forming of the light-transmissive part comprises: forming the first electrode; forming an insulating layer on the first electrode for covering the first electrode; and obtaining the light-shielding part by sequentially forming the base substrate and the second electrode layered on the base substrate on the insulating layer. The insulating layer has a thickness greater than or equal to about 1,000 Å and less than or equal to about 6,000 Å.

For example, the heating temperature is basically greater than the glass transition temperature of the base layer.

For example, material of the base layer comprises flexible resin material.

For example, the base layer comprises acrylic resin, the heating temperature is greater than or equal to about 120° C. and less than or equal to about 150° C.; or the base layer comprises polyethylene terephthalate (PET), the heating temperature is greater than or equal to about 140° C. and less than or equal to about 200° C.; or the base layer comprises polyimide, the heating temperature is greater than or equal to about 180° C. and less than or equal to about 230° C.

For example, the base layer has a thickness greater than or equal to about 1 μm and less than or equal to about 5 μm;

or the second electrode has a thickness greater than or equal to about 500 Å and less than or equal to about 1,000 Å.

For example, material of the first electrode comprises at least one of indium tin oxide (ITO), indium zinc oxide (IZO), gold, silver, aluminum, platinum, palladium, aluminum-doped zinc oxide, or fluorine-doped tin oxide.

For example, the first electrode comprises ITO or IZO, the first electrode has a thickness greater than or equal to about 500 Å and less than or equal to about 2,000 Å; or the first electrode comprises silver or aluminum, the first electrode has a thickness greater than or equal to about 500 Å and less than or equal to about 1,000 Å.

At least one embodiment of the present disclosure provides a method for operating the light valve structure according to claim 1, comprising: applying a first group of voltages to the light valve structure to allow the first electrode and the second electrode to carry different electric charges, in which the light-shielding part is spread due to the mutual adsorption between the first electrode and the second electrode, so as to be superimposed on the light-transmissive part, and light cannot be emitted from the light-transmissive part; and applying a second group of voltages to the light valve structure to allow the light-shielding part to be curled, so as to be away from the light-transmissive part, and the light can be emitted from the light-transmissive part.

BRIEF DESCRIPTION OF THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

Hereinafter, technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, one of ordinary skill in the art can obtain other embodiment(s), without any creative work, which shall be fall within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

With the development of electronic science and technology and the needs of social development, flat panel displays have been widely used. The flat panel displays, for instance, may be divided into active emitting displays and passive emitting displays according to the luminescent mechanism. The active emitting displays, for instance, may include organic light-emitting diode (OLED) displays, electrochromic displays (ECDs), or the like. The passive emitting displays, for instance, include liquid crystal displays (LCDs), electronic ink displays, or the like.

In an LCD, the emission intensity of light (e.g., light provided by a backlight) in each subpixel may be controlled by, for instance, the coactions of a liquid crystal light valve and a polarizer, so that grayscale image display can be realized. But the LCD is usually required to be equipped with the a backlight and the polarizer, on one hand, the power consumption of the LCD is usually relatively large and the thickness cannot be thinner; in addition, as the light transmittance of the polarizer is usually relatively low, the utilization rate of the LCD on a light source is reduced, and the power consumption of the LCD is greatly increased to a certain degree.

Moreover, for instance, the ECD needs not to be equipped with a backlight, so the power consumption can be reduced and the ECD can be made to be thinner But the ECD has slow response speed and poor light-shielding effect, which is unfavorable for the rapid transition of display images or high-contrast image display.

At least one embodiment of the present disclosure provides a light valve structure, which comprises a base substrate, a light-transmissive part and a light-shielding part. The light-transmissive part is disposed on the base substrate, and it is light-transmissive, and at least includes a first electrode. The light-shielding part is disposed on the light-transmissive part; a first end of the light-shielding part is fixed relative to the light-transmissive part; and the light-shielding part is non-transparent and includes a base layer and a second electrode layered on the base layer. The light-shielding part can be curled so as to be away from the light-transmissive part, so light can be emitted from the light-transmissive part; or the light-shielding part can be spread due to the mutual attraction between the first electrode and the second electrode, so as to be superimposed on the light-transmissive part, so the light cannot be emitted from the light-transmissive part.

In the light valve structure provided by at least one embodiment of the present disclosure, the light-shielding part may be curled so as to be away from the light-transmissive part, so the light valve structure can be in light-transmissive 'on' state; or the light-shielding part can be spread so as to be superimposed on the light-transmissive part, so the light valve structure can be in light-shielding 'off' state. The light valve structure can be controlled to be switched between 'on' and 'off', so as to realize the effective control of the intensity of emergent light. The light valve structure has superior light-shielding performance and simple process. For instance, the light valve structure may be combined with an array substrate, or the like. The light valve structure has a broad application prospect in the fields, such as display field and smart home.

Description will be given below to the present disclosure with reference to several exemplary embodiments. Detailed description of known functions and known components may be omitted for clear and simple description of the embodiments of the present disclosure. When any component in the embodiment of the present disclosure appears in more than one figures, the component may be represented by the same reference numeral in each figure.

First Embodiment

Figure 1A:
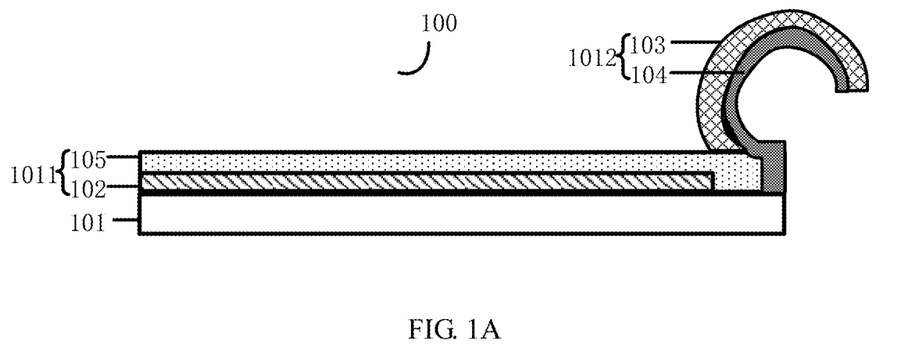
FIG. 1A is a schematically structural cross-section view of a light valve structure in a curled state, provided by a first example of an embodiment of the present disclosure.
Figure 1B:
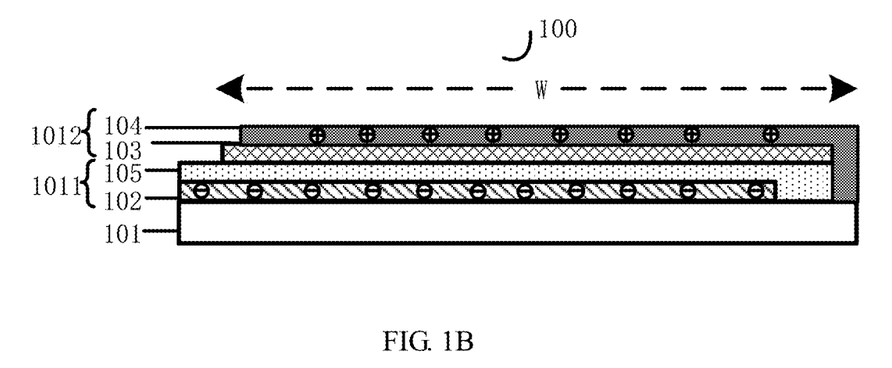
FIG. 1B is a schematically structural cross-section view of the light valve structure in spread state, provided by the first example of the embodiment of the present disclosure.

The embodiment provides a light valve structure 100. FIG. 1A is a schematically structural cross-section view of the light valve structure in a curled state. FIG. 1B is a schematically structural cross-section view of the light valve structure in a spread state.

As shown in FIGS. 1A and 1B, the light valve structure 100 comprises a base substrate 101, a light-transmissive part 1011 which is light-transmissive and is disposed on the base substrate, and a light-shielding part 1012 which is non-transparent and is disposed on the light-transmissive part. As shown in FIGS. 1A and 1B, the light-transmissive part 1011 at least includes a first electrode 102, and the light-shielding part 1012 includes a base layer 103 disposed on the first electrode 102 and a second electrode 104 layered on the base layer 103. The first electrode 102 and the second electrode 104 are electrically insulated from each other. For instance, the light valve structure 100 may have two states. The first state is as shown in FIG. 1A, in which the light-shielding part 1012 can be curled so as to be away from the light-transmissive part 1011; or the second state is as shown in FIG. 1B, in which the light-shielding part 1012 can be spread so as to be superimposed on the light-transmissive part 1011.

As shown in FIGS. 1A and 1B, the example of the material of the base substrate 101 includes inorganic insulating material, such as SiNx, SiOx or glass; or organic insulating material, such as resin materials, polyester materials or polyimide materials; or other suitable materials. The embodiment is not limited thereto.

As shown in FIGS. 1A and 1B, the first electrode 102 is disposed on the base substrate 101. The material of the first electrode 102 may be transparent conductive material or metallic conductive material. For instance, the example of the material of the first electrode 102 includes indium tin oxide (ITO), indium zinc oxide (IZO), gold, silver, aluminum, platinum, palladium, aluminum-doped zinc oxide, fluorine-doped tin oxide, or any combination thereof. For the transparent conductive materials, the first electrode 102 may be entirely platy; and for the metallic conductive materials, the first electrode 102 may be entirely blocky and is provided with at least one hollowed-out or open structure. The thickness of the first electrode 102, for instance, may be different according to different forming materials thereof. For instance, when the first electrode 102 is made from ITO or IZO, the thickness of the first electrode 102 is, for instance, about 500 Å-2,000 Å; and when the first electrode 102 is made from metallic silver or metallic aluminum, the thickness of the first electrode 102 is, for instance, about 500 Å-1,000 Å. The thickness of the first electrode 102 includes but not limited to the values described above.

As shown in FIGS. 1A and 1B, the base layer 103 is disposed on the first electrode 102, and a first end of the base layer (the right end of the base layer 103 in FIG. 1A or 1B) is fixed on the base substrate 101 relative to the first electrode 102. The example of the material of the base layer 103 includes flexible resin materials (e.g., acrylic resin, PET or polyimide). For instance, the base layer 103 can be more easily curled due to the flexible resin materials. In the embodiment, due to the material properties of the base layer 103 and the processing of the base layer 103 in the manufacturing process (which will be described in detail later), as shown in FIG. 1A, the base layer 103 is curled up towards one side away from the light-transmissive part 1011 in the natural state, so that the light-transmissive part 1011 can be at least partially exposed in the direction perpendicular to a plane of the base substrate 101, in this way, light emitted from the light-transmissive part 1011 can run through. For instance, in another example, the base layer 103 may be made of non-transparent flexible material. In the embodiment, the thickness of the base layer 103, for instance, may be about 1 μm-5 μm. If the thickness of the base layer 103 is too thin, the base layer 103 will be broken, which may result in short circuit between the second electrode 104 and the first electrode 102. If the thickness of the base layer 103 is too thick, the curling effect of the base layer 103 will be worse. The thickness of the base layer 103 is not limited to the cases described above.

Figure 3A:
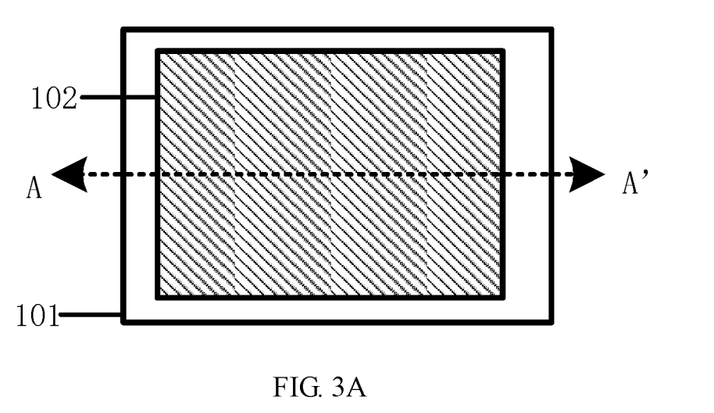
FIGS. 3A-3J are schematically structural cross-section views of a light valve structure in the manufacturing processes, provided by still another embodiment of the present disclosure.

For instance, when the light valve structure 100 comprising the base layer 103 is applied to the display field, e.g., a display panel, each subpixel of the display panel, for instance, may include the light valve structure 100; the length (the W direction as shown in FIG. 1B, or the AA' direction as shown in FIG. 3A) of the base layer 103 in each subpixel, for instance, may be ranged from about 20 μm-200 μm; if the width of the base layer 103 is too small, the curling degree of the base layer 103 will be too small, so the aperture ratio of the pixel will be relatively low; and if the width of the base layer 103 is too large, the base layer 103 with too large size will result in the increased area of each subpixel, so the resolution of the display panel can be reduced. Moreover, for instance, when the light valve structure 100 comprising the base layer 103 is applied in a smart window, the width of the base layer, for instance, may range from about 0.5 mm-5 mm; if the width of the base layer 103 is too small, the curling degree of the base layer 103 is relatively small, so the light transmittance of the smart window is relatively low; and if the width of the base layer 103 is too large, the smart window cannot realize the accurate control of the incident amount of external light. The size range of the base layer 103 is not limited to the values described above.

As shown in FIGS. 1A and 1B, the second electrode 104 is layered on the base layer 103, and a first end of the second electrode is fixed relative to the first electrode 102 (a step part on the right of the second electrode 104 as shown in FIG. 1B). The width of the second electrode 104 is smaller than that of the base layer 103. As shown in FIG. 1B, when the base layer 103 and the second electrode 104 are layered on the first electrode 102 and are in the spread state, the base layer 103, except the first end, are extended to the outside of the edge of the second electrode. As the width of the base layer 103 is greater than that of the second electrode 104, higher aperture ratio can be obtained. The reason includes: in the manufacturing process, the base layer 103 is in a curled state in the natural state by the processing of the base layer 103, such as heating; in the heating process, the base layer 103 will be shrunk; and if the width of the base layer 103 is smaller than that of the second electrode 104, the curling degree of the heated base layer 103 is small, which will affect the aperture ratio. In the embodiment, at least one of the second electrode 104 or the base layer 103 is made from non-transparent material, so the light-shielding part 1012 formed by the base layer 103 and the second electrode 104 is non-transparent. For instance, when the second electrode 104 is made from non-transparent material, the material of the second electrode 104 includes metallic material. For instance, the metallic material may be aluminum, chromium, copper, molybdenum, titanium, aluminum-neodymium alloy, copper-molybdenum alloy, molybdenum-tantalum alloy, molybdenum-neodymium alloy, or any combination thereof. The embodiment is not limited thereto. When the second electrode 104 is made from metallic material, the thickness of a metal layer, for instance, may be about 500 Å-1,000 Å. If the metal layer is too thin, it is possible that the second electrode 104 formed by the metal layer cannot uniformly cover the base layer 103; if the metal layer is too thick, it is possible that the curling degree of the base layer 103 may be affected. The thickness range of the metal layer is not limited to the values described above.

As shown in FIGS. 1A and 1B, the light-shielding part 1012 is formed by the base layer 103 and the second electrode 104 layered on the base layer 103. As shown in FIGS. 1A and 1B, a first end of the light-shielding part 1012 is fixed relative to the light-transmissive part 1011; a second end of the light-shielding part 1012 (the left side of the light-shielding part as shown in FIG. 1B) may be curled so as to be away from the light-transmissive part 1011 or may be spread so as to be superimposed on the light-transmissive part 1011; and the first end and the second end are opposite to each other. In the embodiment, due to the material properties of the base layer 103 and the processing of the base layer 103 in the manufacturing process, the base layer 103 is curled up towards one side away from the light-transmissive part 1011 in the natural state. As the second electrode 104 is layered on the base layer 103, under the action of the curling force of the base layer 103, the second electrode 104 is also curled along the curling direction of the base layer 103. In this way, as shown in FIG. 1A, in the natural state, the light-shielding part 1012 of the light valve structure 100 is curled towards one side away from the light-transmissive part 1011, namely being curled up towards the fixed position of the light-shielding part 1012 and being fixed. For instance, when the light-shielding part 1012 is curled towards one side away from the light-transmissive part 1011 and external light is irradiated to the light-shielding part 1012 through the light-transmissive part 1011, on one side of the base substrate 101, as the light-transmissive part 1011 is light-transmissive, the light is emitted from a non-shielded part of the light-transmissive part 1011, so the light valve structure 100 has light-transmissive function. It can be defined that the light valve structure 100 is in the 'on' state at this point.

As shown in FIG. 1B, under the action of external electrical signals, for instance, the first electrode 102 may be negatively charged and the second electrode 104 may be positively charged. In this case, there is a force of attraction between the first electrode 102 and the second electrode 104, the curled light-shielding part 1012 may be spread under the action of the force of attraction so as to be superimposed on the light-transmissive part 1011. The exemplary embodiments will be described in detail later. No further description will be given here in the embodiment. For instance, when the light-shielding part 1012 is laid and superimposed on the light-transmissive part 1011 and the external light is irradiated to the light-shielding part 1012 through the light-transmissive part 1011, on one side of the base substrate 101, as the light-shielding part 1012 is non-transparent, the light is shielded by the light-shielding part 1012 and cannot be emitted, so the light valve structure 100 has light-shielding function. It can be defined that the light valve structure 100 is in the 'off' state at this point. The size of the light-shielding part 1012, for instance, is basically equivalent to or slightly smaller than the size of the light-transmissive part 1011. In another example, a non-transparent light-shielding layer may be formed on the light-transmissive part 1011. The light-shielding layer is disposed on the periphery when the light-shielding part 1012 is superimposed on the light-transmissive part 1011. In this way, the contrast of the light valve structure can be improved. For instance, the light-shielding layer may be made from metallic material, for instance, it can be formed at the same time when the metallic second electrode 104 is formed.

In the light valve structure 100 provided by at least one embodiment of the present disclosure, the light-shielding part 1012 can be curled so as to be away from the light-transmissive part 1011, so that light can be emitted from the light-transmissive part, and the light valve structure 100 is in the light-transmissive 'on' state; or the light-shielding part 1012 can be spread so as to be superimposed on the light-transmissive part 1011, so that the light cannot be emitted from the light-transmissive part 1011, and the light valve structure 100 is in the light-shielding 'off' state. In addition, in at least one example of the embodiment, the light valve structure 100 is made from metal and flexible resins. This composite structure enhances the toughness of the light valve structure 100 and allows the light valve structure 100 to have superior light-shielding performance. The light valve structure 100 has high light-shielding efficiency and simple process, and has a broad application prospect in the fields, such as display field and smart home.

In another example of the embodiment, as shown in FIGS. 1A and 1B, the light-transmissive part 1011 of the light valve structure 100 may also include an insulating layer 105, and the insulating layer 105 is layered on the first electrode 102 and disposed between the first electrode 102 and the base layer 103. When the light valve structure 100 is in the 'on' state, the light-shielding part 1012 of the light valve structure is curled so as to be away from the light-transmissive part 1011 including the first electrode 102 and the insulating layer 105; and when the light valve structure 100 is in the 'off' state, the light-shielding part 1012 is spread and superimposed on the insulating layer 105. The insulating layer 105 is made from light-transmissive material. For instance, the example of the material of the insulating layer 105 includes any suitable transparent insulating material, such as silicon nitride, silicon oxide or silicon oxynitride. The embodiment is not limited thereto. The thickness of the insulating layer 105, for instance, may be about 1,000 Å-6,000 Å, but the embodiment is not limited thereto.

For instance, when the insulating layer 105 is made from any one or more of inorganic materials, such as silicon nitride, silicon oxide or silicon oxynitride, and the base layer 103 is made from flexible resin material, in the process of heating the light valve structure 100 comprising the insulating layer 105, the surface energy between the base layer 103 and the insulating layer 105 is reduced; the adhesivity is decreased; and the shrinkage rate of the base layer 103 made from the resin material is much greater than the shrinkage rate of the insulating layer 105 made from the inorganic material, so the base layer 103 can be more easily curled.

It should be noted that not all the structures of the light valve structure 100 are given in the figure for clarity. In order to realize the necessary functions of the light valve structure, other structures not shown may be set by one of ordinary skill in the art.

Figure 1C:
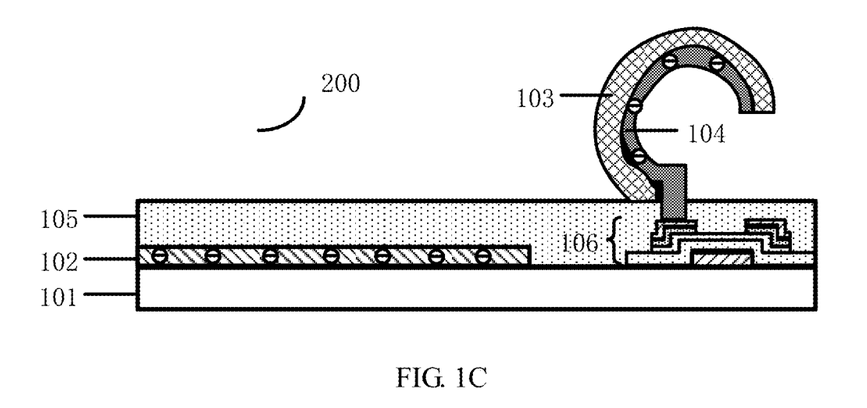
FIG. 1C is a schematically structural cross-section view of a light valve structure in a curled state, provided by a second example of the embodiment of the present disclosure.
Figure 1D:
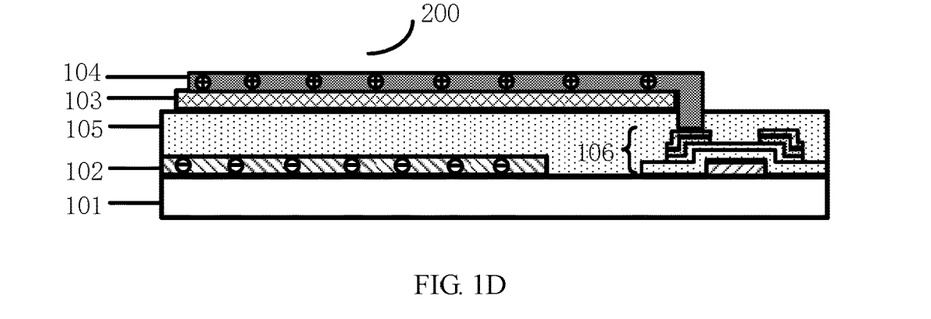
FIG. 1D is a schematically structural cross-section view of the light valve structure in spread state, provided by the second example of the embodiment of the present disclosure.

FIGS. 1C and 1D are schematically structural cross-section views of a light valve structure 100 provided by another example of the embodiment. As shown in FIGS. 1C and 1D, except that the light valve structure 200 further comprises a switching element 106, the structure of the light valve structure 200 in the example may be basically the same as the structure of the light valve structure 100 as shown in FIGS. 1A and 1B.

As shown in FIGS. 1C and 1D, the switching element 106 is disposed on the base substrate 101. The switching element 106, for instance, may be any appropriate switching element, such as a transistor, a diode or a photoelectric switch. The example of the embodiment of the present disclosure is not limited thereto. As shown in FIGS. 1C and 1D, the insulating layer 105 includes a through hole; the second electrode 104 of the light valve structure 200 includes an anchoring part; and the anchoring part fastens/fixes the light-shielding part 1012 on the base substrate 101 and is electrically connected with the switching element 106 via the through hole formed in the insulating layer 105. In this way, the voltage on the second electrode 104 may be controlled by controlling the 'on' and 'off' of the switching element 106, so the state of the light valve structure may be controlled by controlling the state of the light-shielding part 1012. In the example, the switching element 106 is a transistor (e.g., a TFT); a gate electrode of the switching element is connected with a control end; a drain electrode is electrically connected with the second electrode 104; and a source electrode is electrically connected with the power supply signal. In different examples, the control end is, for instance, coupled to a driving circuit, a switch button, or the like. The material of an active layer of the TFT may be amorphous silicon (a-Si), polycrystalline silicon (poly-Si), oxide semiconductors or the like, but the embodiment of the present disclosure is not limited thereto.

Second Embodiment

Figure 2A:
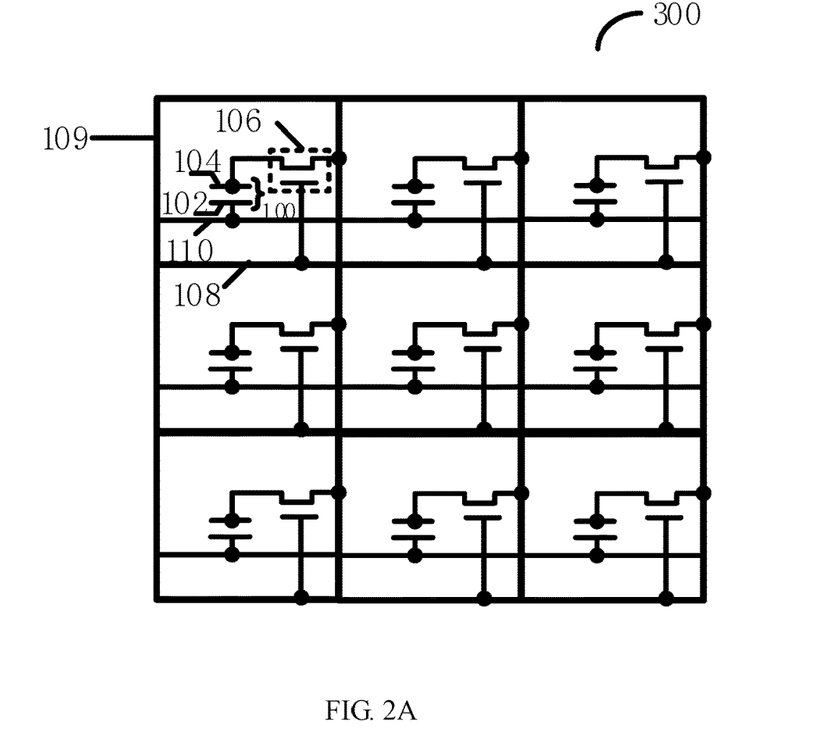
FIG. 2A is a schematically structural plan view of an array substrate provided by another embodiment of the present disclosure.

At least one embodiment of the present disclosure provides an array substrate 300, which comprises any light valve structure provided by the above embodiment. FIG. 2A is a schematically structural plan view of the array substrate 300.

As shown in FIG. 2A, the array substrate 300 further comprises an array circuit. The array circuit includes a plurality of gate lines 108, a plurality of data lines 109 and a plurality of common electrode lines 110. The common electrode lines 110 are basically parallel to the gate lines 108. The plurality of gate lines 108 and the plurality of data lines 109 are horizontally and vertically intersected with each other to divide the array substrate 300 into a plurality of subpixels arranged in a matrix. Each subpixel includes a light valve structure 100 and a switching element 106. The plurality of gate lines 108, for instance, are electrically connected with a gate driving circuit (not shown); the plurality of data lines 109, for instance, are electrically connected with a data driving circuit (not shown); and the common electrode lines 110, for instance, are electrically connected with a common power terminal. The array substrate 300 may further comprise a black matrix (not shown) formed by a light-shielding layer, so as to isolate the subpixels from each other, prevent the crosstalk between the subpixels, and improve the contrast.

As shown in FIG. 2A, the switching element 106, for instance, may be a transistor, and may include a control end, a first end and a second end. Description is given in the embodiment by taking the case that the switching element 106 is a TFT as an example, and the material of an active layer of the TFT, for instance, may be a-Si, poly-Si, oxide semiconductors, etc. The embodiment is not limited thereto. For instance, a gate electrode of the TFT is the control end; one of a source electrode and a drain electrode of the TFT is the first end; and the other one of the source electrode and the drain electrode of the TFT is the second end.

As shown in FIG. 2A, for instance, a first electrode 102 of the light valve structure 100 is electrically connected with the common electrode line 110, an anchoring part of a second electrode 104 of the light valve structure 100 is electrically connected with the drain electrode of the TFT 106, the gate line 108 is electrically connected with the gate electrode of the TFT 106, and the date line 109 is electrically connected with the source electrode of the TFT; or the first electrode 102 of the light valve structure 100 is connected with the common electrode line 110, the anchoring part of the second electrode 104 of the light valve structure 100 is electrically connected with the source electrode of the TFT 106, the gate line 108 is electrically connected with the gate electrode of the TFT 106, and the data line 109 is electrically connected with the drain electrode of the TFT. Under the control of the gate electrode, an electrical signal applied by the data line 109, for instance, may charge and discharge the second electrode 104 of the light valve structure 100 through the TFT 106, so the second electrode 104 of the light valve structure 100 can carry charges of corresponding types.

For instance, in an example, the common electrode line 110 applies a first electrical signal to the first electrode 102 of the light valve structure 100; the data line 109 applies a second electrical signal to the light valve structure 100 through the TFT 106; by controlling the first electrical signal and the second electrical signal, the first electrode 102 and the second electrode 104 of the light valve structure 100 carry different charges, so that the first electrode 102 and the second electrode 104 attract each other due to carrying different charges, in this way, the second electrode 104 and the base layer 103 in the curled state are spread towards the direction close to the first electrode 102 under the action of the force of attraction, until the light-shielding part 1012 is fully spread and superimposed on the light-transmissive part 1011. For instance, when the light-shielding part 1012 is laid and superimposed on the light-transmissive part 1011 and external light is irradiated to the light-shielding part 1012 through the light-transmissive part 1011, on one side of the base substrate 101, as the light-shielding part 1012 is non-transparent, the light is shielded by the light-shielding part 1012 and cannot be emitted, so the array substrate 300 is in dark state.

For instance, the first electrode 102 and the second electrode 104 of the light valve structure 100 carry same electric charges by changing the first electrical signal applied to the first electrode 102 and the second electrical signal applied to the second electrode 104. As the first electrode 102 and the second electrode 104 carrying the same electric charges repel each other, under the action of the repelling force, the second electrode 104 will move towards the direction away from the first electrode 102. As the first side of the light-shielding part 1012 including the base layer 103 and the second electrode 104 is fixed relative to the light-transmissive part 1011, under the action of the curling force of the base layer 103, the light-shielding part 1012 will be curled up towards the direction away from the light-transmissive part 1011, and be fixed. For instance, when the light-shielding part 1012 of the light valve structure 100 is curled so as to be away from the light-transmissive part 1011 and the external light is irradiated to the light-shielding part 1012 through the light-transmissive part 1011, on a side of the base substrate 101, as the light-transmissive part 1011 is light-transmissive, the light is emitted from a non-shielded part of the light-transmissive part 1011, so the array substrate 300 is in bright state.

In another example, as the base layer 103 of the light valve structure 100 is in a curled state in the natural state, in the case of canceling the first electrical signal applied to the first electrode 102 and the second electrical signal applied to the second electrode 104, the light-shielding part 1012 of the light valve structure 100 may also be curled so as to be away from the light-transmissive part 1011, so the array substrate 300 is in light-transmissive bright state.

In the array substrate 300 provided by at least one embodiment of the present disclosure, the gate line 108 is electrically connected with the control end of the switching element 106; the data line 109 is electrically connected with the first end of the switching element 106; the anchoring part of the second electrode 104 of the light valve structure 100 is electrically connected with the second end of the switching element 106; and the first electrode 102 of the light valve structure 100 is electrically connected with the common electrode line 110. The common electrode line 110 applies the first electrical signal to the first electrode 102 of the light valve structure 100, and the data line 109 applies the second electrical signal to the light valve structure 100 through the TFT 106. By controlling the first electrical signal and the second electrical signal, the light-shielding part 1012 of the light valve structure 100 can be curled so as to be away from the light-transmissive part 1011 or be spread so as to be superimposed on the light-transmissive part 1011, so that light can be emitted from the array substrate or cannot be emitted from the array substrate.

The technical effects of the array substrate 300 provided by the embodiment may refer to the technical effects of any light valve structure provided by the first embodiment. No further description will be repeated here.

Figure 2B:
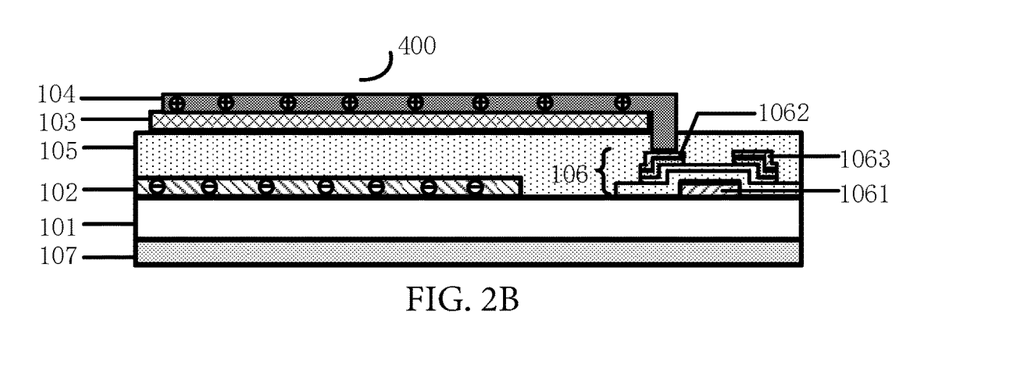
FIG. 2B is a schematically structural cross-section view of an electronic device provided by another embodiment of the present disclosure.

FIG. 2B is a schematically structural cross-section view of an electronic device 400 provided by another example of the embodiment. The electronic device 400 comprises any light valve structure or any array substrate provided by the above embodiments.

The electronic device 400, for instance, may be any product or component including the light valve structure, e.g., a touch panel, a display panel, a display device, a TV, e-paper, a mobile phone, a tablet PC, a notebook computer, a digital camera, a navigator or a smart window. For instance, for the display device, the display device may comprise the above array substrate 300.

As shown in FIG. 2B, the switching element 106 of the electronic device 400, for instance, may be a TFT. For instance, the TFT 106 includes structures, such as a gate electrode 1061, a drain electrode 1062 and a source electrode 1063. Moreover, the gate electrode 1061 of the TFT 106 is electrically connected with the gate line 108; the drain electrode 1062 is electrically connected with the second electrode 104 of the light valve structure; and the source electrode 1063 is electrically connected with the data line 109.

As shown in FIG. 2B, the electronic device 400 also comprises a backlight 107. The backlight 107, for instance, may be disposed on a side of the base substrate 101 provided with the light-transmissive part 1011, or the backlight 107 may be disposed on a side of the base substrate 101 away from the light-transmissive part 1011. The embodiment is not limited thereto. Description is given in an example that the backlight 107 is disposed on the side of the base substrate 011 away from the light-transmissive part 1011. When the light-shielding part 1012 of the light valve structure is curled so as to be away from the light-transmissive part 1011, as the light-transmissive part 1011 of the light valve structure is light-transmissive, light provided by the backlight can be emitted from a non-shielded part of the light-transmissive part 101 of the light valve structure. When the light-shielding part 1012 of the light valve structure is laid and superimposed on the light-transmissive part 1011, as the light-shielding part 1012 of the light valve structure is non-transparent, the light provided by the backlight cannot be emitted as being shielded by the light-shielding part 1012.

The backlight 107 is a surface light source and may be various appropriate types. For instance, in one example, the backlight 107 includes a light guide plate (LGP) and a fluorescent lamp or a plurality of light-emitting diodes (LEDs) disposed on a side of the LGP, so a side-lit backlight is obtained. In another example, the backlight 107 includes an LGP and a plurality of LEDs disposed on a side of the LGP, so a direct-lit backlight is obtained. In yet another example, the backlight is an organic light-emitting diode (OLED) display panel.

It should be noted that not all the structures of the array substrate 300 or the electronic device 400 are given in the figure in the embodiment for clarity. In order to realize the necessary functions of the array substrate or the electronic device, other structures not shown may be set by one of ordinary skill in the art.

The technical effects of the electronic device may refer to the technical effects of any light valve structure or any array substrate provided by the above embodiments. No further description will be repeated here.

Third Embodiment

The embodiment provides a method for manufacturing a light valve structure 100. FIGS. 3A-3J are schematically structural cross-section views of the light valve structure 100 provided by the embodiment in the manufacturing process.

Figure 3B:
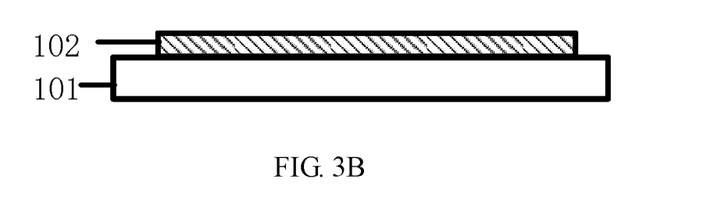

FIG. 3A is a schematically structural plan view of the light valve structure 100 in the manufacturing process. FIG. 3B is a schematically structural cross-section view cut away along the A-A' line of FIG. 3A. As shown in FIGS. 3A and 3B, a base substrate 101 is provided at first. The example of the material of the base substrate 101 includes inorganic insulating material, such as SiNx, SiOx, or glass, or organic insulating material, such as resin materials, polyester materials or polyimide materials, or other suitable materials. The embodiment is not limited thereto.

As shown in FIGS. 3A and 3B, for instance, an electrode layer film may be deposited on the base substrate 101 by chemical vapor deposition (CVD) or physical vapor deposition (PVD) process; and a first electrode 102 is formed on the base substrate 101 by patterning the electrode layer film by photolithography including operations, such as exposure, development and etching. The first electrode 102 is made from transparent conductive material. For instance, the example of the material of the first electrode 102 includes ITO, IZO, gold, silver, aluminum, platinum, palladium, aluminum-doped zinc oxide, fluorine-doped tin oxide, or any combination thereof. The thickness of the formed first electrode 102 may be different according to different forming materials thereof. For instance, if the first electrode 102 is made from ITO or IZO, the thickness of the first electrode 102, for instance, is about 500 Å-2,000 Å; and if the first electrode 102 is made from metallic silver or metallic aluminum, the thickness of the first electrode 102, for instance, is about 500 Å-1,000 Å. The thickness of the first electrode 102 includes but not limited the cases described above. The embodiment is not limited thereto.

Figure 3C:
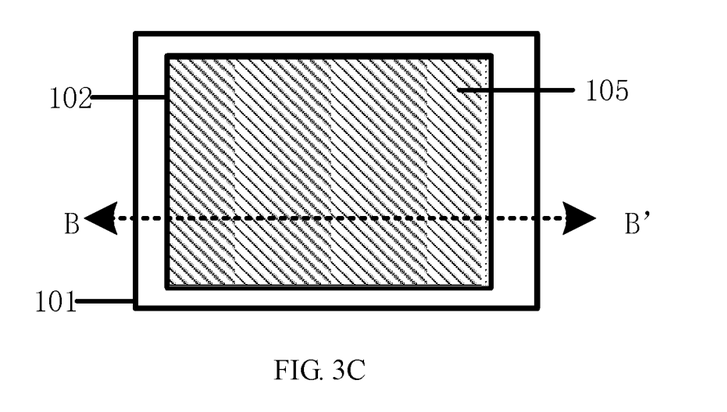
Figure 3D:
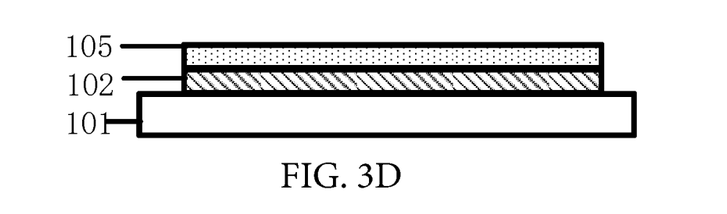

FIG. 3C is a schematically structural plan view of the light valve structure 100 in the manufacturing process. FIG. 3D is a schematically structural cross-section view cut away along the B-B' line of FIG. 3C. As shown in FIGS. 3C and 3D, after the first electrode 102 is formed on the base substrate 101, for instance, an insulating layer film may be deposited on the first electrode 102 by a CVD process or a PVD process; and an insulating layer 105 is formed by patterning the insulating layer film by photolithography. The example of the material of the insulating layer 105 includes any suitable transparent insulating material, such as silicon nitride, silicon oxide or silicon oxynitride. The thickness of the insulating layer 105, for instance, may be about 1,000 Å-6,000 Å, but the embodiment is not limited thereto.

Figure 3E:
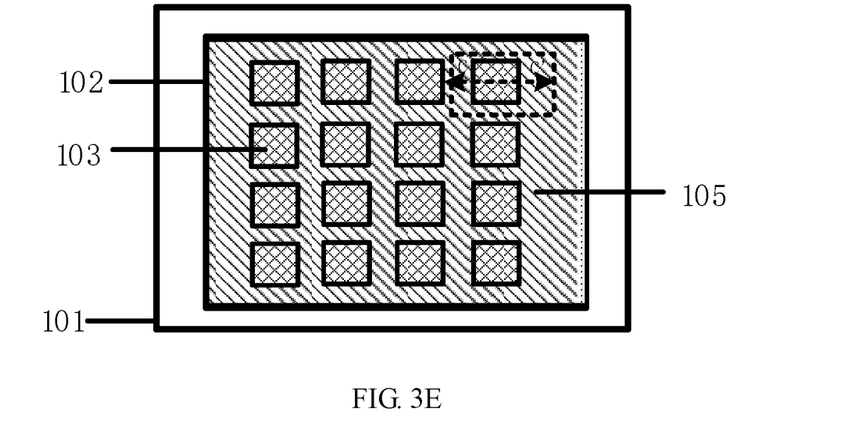
Figure 3F:
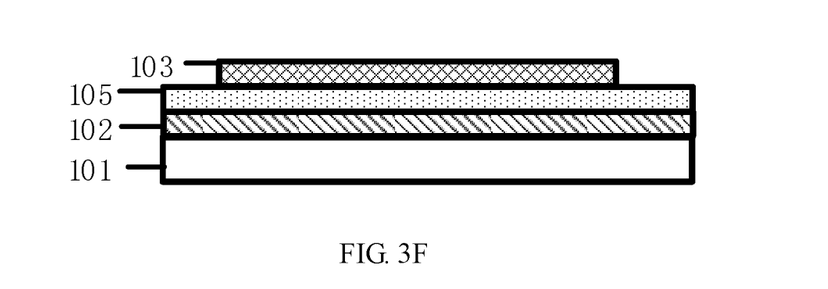

FIG. 3E is a schematically structural plan view of the light valve structure 100 in the manufacturing process. FIG. 3F is a schematically structural cross-section view cut away along the C-C' line in dotted lines of FIG. 3E. As shown in FIGS. 3E and 3F, after the insulating layer 105 is formed on the first electrode 102, for instance, a base film may be deposited on the insulating layer 105 by a CVD process or a PVD process; and a plurality of base layers 103 arranged in an array are formed on the insulating layer 105 by patterning the base film by photolithography. The example of the material of the base layer 103 includes flexible resin materials (e.g., acrylic type resins, PET or polyimide). For instance, in another example, the base layer 103, for instance, may be made from non-transparent flexible material. The thickness of the base layer 103, for instance, may be about 1 μm-5 μm. If the thickness is too thin, the base layer 103, for instance, may be broken during depositing, which may lead to short circuit between a subsequently formed second electrode 104 and the first electrode 102. If the thickness is too thick, the curling effect of the base layer 103 will be worse. The thickness of the base layer 103 is not limited to the cases described above.

Figure 3G:
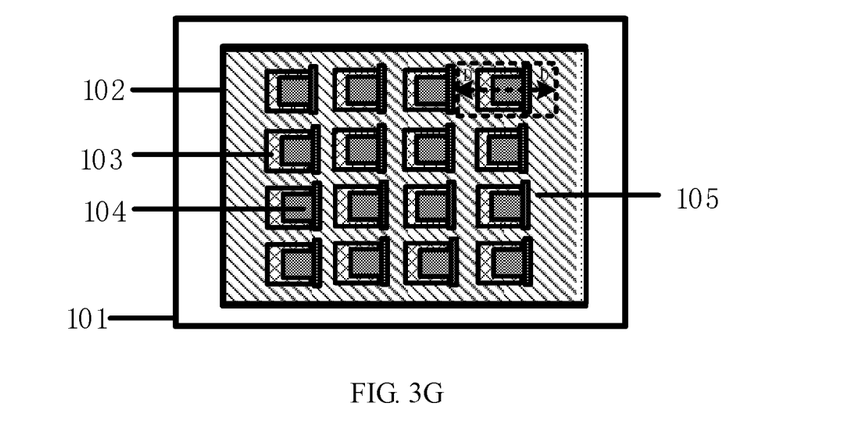
Figure 3H:
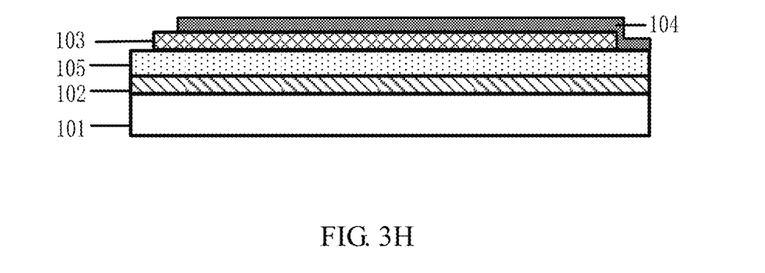

FIG. 3G is a schematically structural plan diagram of the light valve structure 100 in the manufacturing process. FIG. 3H is a schematically structural cross-section view cut away along the D-D' line in dotted lines of FIG. 3G. As shown in FIGS. 3G and 3H, for instance, an electrode layer film may be deposited on the insulating layer 105 provided with the base layers 103 by a CVD process or a PVD process; second electrodes 104, in one-to-one correspondence with the base layers 103, arranged in an array are formed on the base layers 103 by patterning the electrode layer film by photolithography; and the formed second electrodes 104 are electrically insulated from the first electrodes 102. As shown in FIGS. 3G and 3H, the second electrode 104 includes an anchoring part (a vertical strip part of the second electrode 104 in FIG. 3G) on a first side thereof. Except the anchoring part of the second electrode 104, the base layer 103 is extended to the outside of the edge of the second electrode 104. At least one of the second electrode 104 or the base layer 103 is made from non-transparent material, so the light-shielding part 1012 formed by the base layer 103 and the second electrode 104 is non-transparent.

For instance, when the second electrode 104 is made from non-transparent material, the material of the second electrode 104 includes metallic material. For instance, the metallic material may be aluminum, chromium, copper, molybdenum, titanium, aluminum-neodymium alloy, copper-molybdenum alloy, molybdenum-tantalum alloy, molybdenum-neodymium alloy, or any combination thereof. The embodiment is not limited thereto. When the second electrode 104 is made from the metallic material, the thickness of a metal layer, for instance, may be about 500 Å-1,000 Å. If the metal layer is too thin, the second electrode 104 formed by the metal layer may be unable to cover the base layer 103. If the metal layer is too thick, the curling degree of the base layer 103 may be affected. However, the thickness range of the metal layer in the embodiment of the present disclosure is not limited to the cases described above.

Figure 3I:
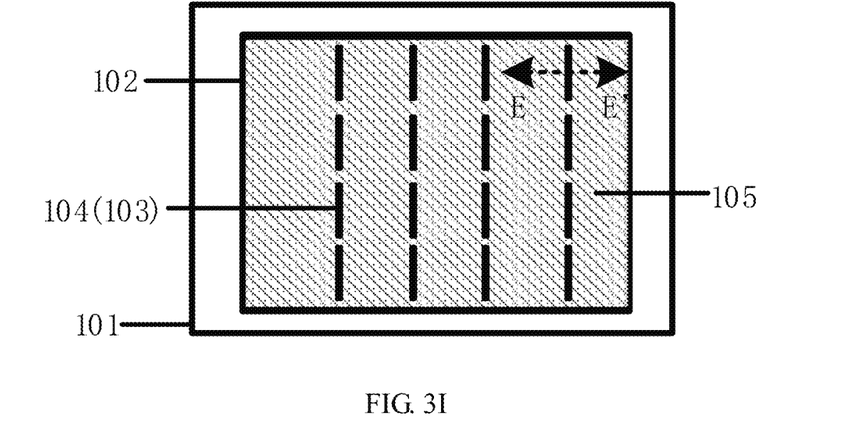
Figure 3J:
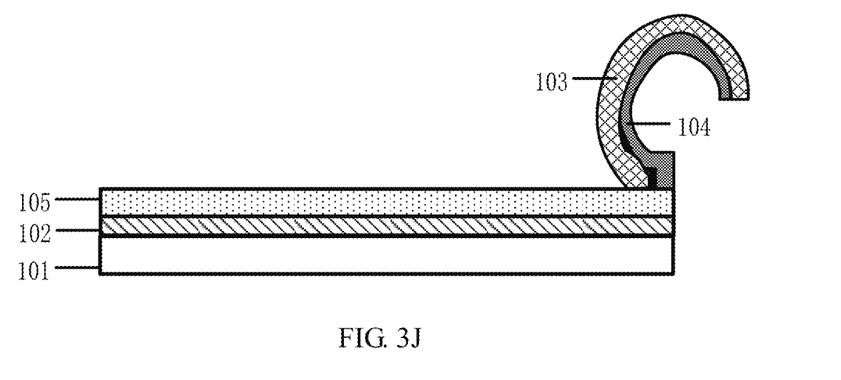

FIG. 3I is a schematically structural plan view of the light valve structure 100 in the manufacturing process. FIG. 3J is a schematically structural cross-section view cut away along the E-E line in FIG. 3I. As shown in FIGS. 3I and 3J, after the second electrode 104 is formed, the structure is heated, and the heating temperature, for instance, is slightly greater than the glass transition temperature of the base layer 103. For instance, the structure may be heated by a baking heating process. The baking temperature range may be different according to different materials of the base layer 103. For instance, when the base layer 103 is made from acrylic type resins, the baking temperature, for instance, may be about 120° C.-150° C.; when the base layer 103 is made from PET, the baking temperature, for instance, may be about 180° C.-230° C.; and when the base layer 103 is made from polyimide, the baking temperature, for instance, is about 140° C.-200° C. The baking time, for instance, may be about 2 hours-4 hours.

For instance, in at least one example, when the base layer 103 is made from flexible resin material and the insulating layer 105 is made from inorganic material, in the heating process, the base layer 103 is softened; and along with the rise of the heating temperature and the prolongation of the heating time, the surface energy between the base layer 103 and the underlying insulating layer 105 will be gradually decreased, and the adhesivity will be gradually decreased. Moreover, as the shrinkage rate of the base layer 103 made from resins is greater than the shrinkage rate of the insulating layer 105 formed by an inorganic film, under the action of the stress of the base layer 103, interfaces of the base layer and the insulating layer are separate, and the base layer 103 is shrunk towards the direction away from the first electrode 102. As the second electrode 104 is layered on the base layer 103 and the second electrode 104 includes the anchoring part on the first side thereof, the base layer 103 and the second electrode 104 are curled towards the direction away from the first electrode 102 together, and are then fixed. After the baking process according to the preset heating time and heating temperature is performed, for instance, a cooling process may be performed, for instance, the temperature may be cooled down to the room temperature. During cooling, the curled form of the base layer 103 is gradually fixed, so as to form the light valve structure 100. In this way, in the natural state, the light-shielding part 1012 including the base layer 103 and the second electrode 104 is curled and away from the light-transmissive part 1011.

In the manufacturing method of the light valve structure 100 provided by at least one embodiment of the present disclosure, by controlling the factors, such as the heating time and the heating temperature, the surface energy between the base layer 103 and the insulating layer 105 below is gradually decreased, and the adhesivity is gradually decreased; and the base layer 103 is shrunk towards the direction away from the first electrode 102 and is fixed. The light-shielding part 1012 including the base layer 103 and the second electrode 104 can be curled so as to be away from the light-transmissive part 1011, so that light can be emitted from the light-transmissive part 1011, and the light valve structure 100 is in light-transmissive 'on' state.

In addition, in at least one example of the embodiment, the light valve structure 100 is made from metal and flexible resins. This composite structure enhances the toughness of the light valve structure and allows the light valve structure 100 to have superior light-shielding performance. The light valve structure 100 has high light-shielding efficiency and simple process, and has a broad application prospect in the fields, such as display field and smart home.

Another embodiment of the present disclosure provides a method for manufacturing an electronic device comprising the light valve structures. In the method, a base substrate 101 is provided at first; switching elements or an array circuit is formed on the base substrate 101; the array circuit includes gate electrodes, data lines, common electrode lines, switching elements, or the like; and subsequently, the light valve structures 100 are formed by subsequent operations, and the second electrode 104 is electrically connected with one end of the switching element via a through hole formed in the insulating layer 105. The process for preparing the switching elements or the array circuit may adopt a conventional method.

Fourth Embodiment

Figure 4:
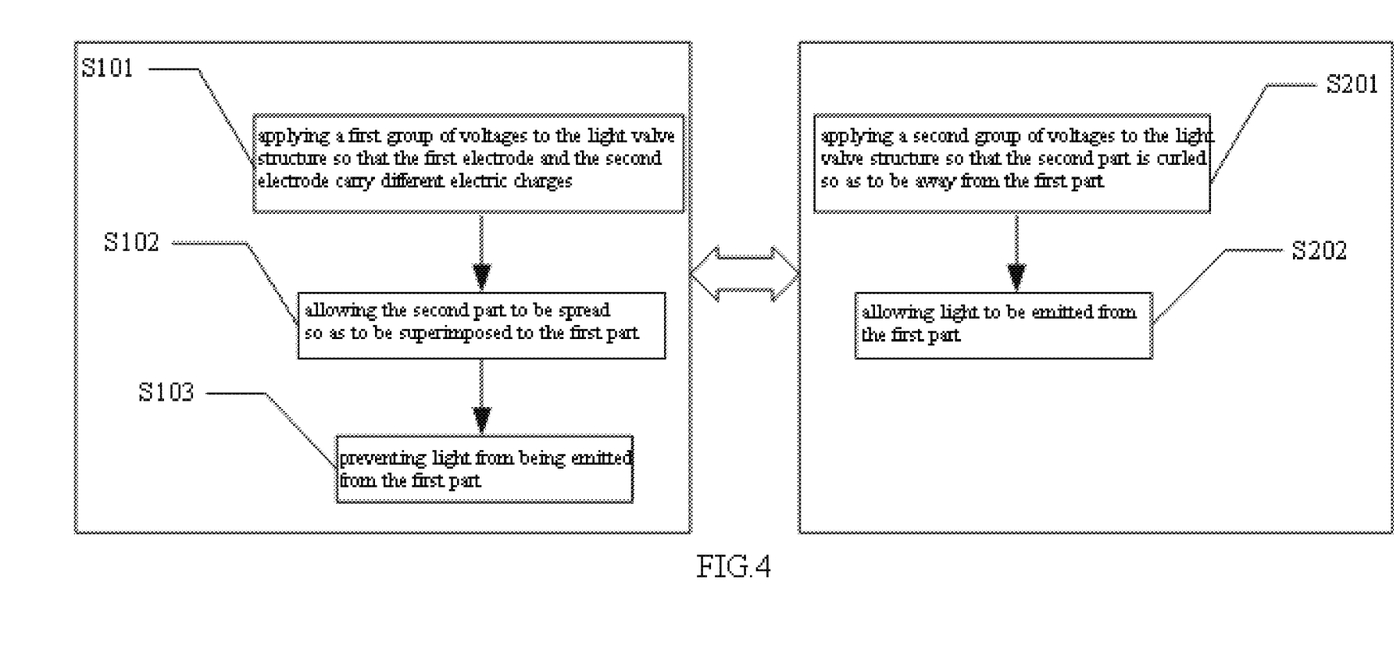
FIG. 4 is a flowchart of an operation method of the light valve structure provided by yet another embodiment of the present disclosure.

The embodiment provides an operating method of a light valve structure. The method, for instance, may be used for operating the light valve structure provided by any foregoing embodiments. FIG. 4 is a flowchart of the operating method of the light valve structure provided by the embodiment. As shown in FIG. 4, the operating method of the light valve structure comprises the following operations.

S101: applying a first group of voltages to the light valve structure in such a way that the first electrode 102 and the second electrode 104 carry different/opposite electric charges.

S102: allowing the light-shielding part 1012 to be spread so as to be superimposed on the light-transmissive part 1011.

S103: preventing light from being emitted from the light-transmissive part 1011.

As an alternative way, S201: applying a second group of voltages to the light valve structure in such a way that the light-shielding part 1012 is curled so as to be away from the light-transmissive part 1011.

S202: allowing light to be emitted from the light-transmissive part 1011.

For instance, in the operation S101, the range of the first group of voltages, for instance, may be about 5V-100V, but the embodiment is not limited thereto.

For instance, in the operation S201, the second group of voltages may be that: corresponding voltages are applied to the light valve structure in such a way that the first electrode 102 and the second electrode 104 carry same electric charges; and due to the mutual repelling force between the first electrode 102 and the second electrode 104, the second electrode 104 will move towards the direction away from the first electrode 102, so the light-shielding part 1012 is curled so as to be away from the light-transmissive part 1011. As an alternative way, in another example, the second group of voltages may be that: both the first electrode 102 and the second electrode 104 do not carry charges, as the base layer 103 of the light valve structure is in a curled state in the natural state, at this point, the light-shielding part 1012 will also be correspondingly curled so as to be away from the light-transmissive part 1011.

The light valve structure is in light-shielding 'off' state after the operations S101-S103, and the light valve structure is in light-transmissive 'on' state after the operations S201-S202. The light valve structure may convert between 'on' and 'off' states by controlling electrical signals applied to the light valve structure.

Similarly, another embodiment of the present disclosure provides an operating method of the electronic device including the light valve structures. The operating method includes the operating method of the light valve structure and further comprises: for instance, controlling subpixels through a driving circuit or the like, so as to control the light valve structure of the subpixel to be light-transmissive or not.

Without conflict with each other, the features in different embodiments, or the same embodiment of the present disclosure may be combined.

The foregoing is only the exemplary embodiments of the present disclosure and not intended to limit the scope of protection of the present disclosure. The scope of the present disclosure shall be defined by the claims.

What is claimed is:
1. A light valve structure, comprising;
   a base substrate;
   a light-transmissive part provided on the base substrate, in which the light-transmissive part at least includes a first electrode; and
   a light-shielding part provided on the light-transmissive part, in which a first end of the light-shielding part is fixed relative to the light-transmissive part, and the light-shielding part includes a base layer and a second electrode layered on the base layer;
   wherein the light-shielding part is configured to be curled so as to be away from the light-transmissive part; or
   the light-shielding part is configured to be spread due to the mutual adsorption between the first electrode and the second electrode, so as to be superimposed on the light-transmissive part;
   wherein a second end of the light-shielding part may be curled so as to be away from the light-transmissive part or be spread so as to be superimposed on the light-transmissive part, when the light-shielding part is superimposed on the light-transmissive part and is in the spread state, an orthographic projection of the base layer on the base substrate covers an orthographic projection of the second electrode on the base substrate.

2. The light valve structure according to claim 1, wherein the light-transmissive part further comprises an insulating layer provided on a side of the first electrode away from the base substrate.

3. The light valve structure according to claim 1, wherein the base layer comprises non-transparent material, or the second electrode comprises non-transparent metallic material.

4. The light valve structure according to claim 1, further comprising a switching element, wherein the switching element is provided on the base substrate; and a first end of the second electrode is electrically connected with the switching element.

5. The light valve structure according to claim 4, wherein the second electrode comprises an anchoring part so as to be fixed on the base substrate, the anchoring part being disposed at the first end of the second electrode and electrically connected with the switching element.

6. An array substrate, comprising the light valve structure according to claim 1.

7. The array substrate according to claim 6, further comprising a gate line, a data line, a common electrode line and a switching element, wherein
the first electrode is electrically connected with the common electrode line;
the switching element comprises a control end, a first end and a second end;
the gate line is electrically connected with a control end of the switching element; the data line is electrically connected with a first end of the switching element; the second electrode comprises an anchoring part, the anchoring part of the second electrode being electrically connected with the second end of the switching element.

8. A method for operating the light valve structure according to claim 1, comprising:
applying a first group of voltages to the light valve structure to allow the first electrode and the second electrode to carry electric opposite charges, in which the light-shielding part is spread due to the mutual adsorption between the first electrode and the second electrode, so as to be superimposed on the light-transmissive part, and light cannot be emitted from the light-transmissive part; and
applying a second group of voltages to the light valve structure to allow the light-shielding part to be curled, so as to be away from the light-transmissive part, and the light can be emitted from the light-transmissive part.

9. An electronic device, comprising an array substrate, wherein the array substrate comprises a light valve structure, wherein the light valve structure comprises:
a base substrate;
a light-transmissive part provided on the base substrate, in which the light-transmissive part at least includes a first electrode; and
a light-shielding part provided on the light-transmissive part, in which a first end of the light-shielding part is fixed relative to the light-transmissive part, and the light-shielding part includes a base layer and a second electrode layered on the base layer;
wherein the light-shielding part is configured to be curled so as to be away from the light-transmissive part; or
the light-shielding part is configured to be spread due to the mutual adsorption between the first electrode and the second electrode, so as to be superimposed on the light-transmissive part;
wherein a second end of the light-shielding part may be curled so as to be away from the light-transmissive part or be spread so as to be superimposed on the light-transmissive part, when the light-shielding part is superimposed on the light-transmissive part and is in the spread state, an orthographic projection of the base layer on the base substrate covers an orthographic projection of the second electrode on the base substrate.

10. The electronic device according to claim 9, further comprising a backlight, wherein the backlight is provided on a side of the base substrate provided with the light-transmissive part; or the backlight is provided on a side of the base substrate away from the light-transmissive part.

11. A method for manufacturing a light valve structure, comprising:
forming a light-transmissive part comprising a first electrode;
obtaining a light-shielding part by sequentially forming a base layer and a second electrode layered on the base substrate on the first electrode, in which a first end of the light-shielding part is fixed relative to the light-transmissive part; and
curling the light-shielding part by heating, so as to be away from the light-transmissive part;
wherein a second end of the light-shielding part may be curled so as to be away from the light-transmissive part or be spread so as to be superimposed on the light-transmissive part, when the light-shielding part is superimposed on the light-transmissive part and is in the spread state, an orthographic projection of the base layer on the base substrate covers an orthographic projection of the second electrode on the base substrate.

12. The method according to claim 11, wherein forming of the light-transmissive part comprises:
forming the first electrode;
forming an insulating layer on the first electrode for covering the first electrode; and
obtaining the light-shielding part by sequentially forming the base substrate and the second electrode layered on the base substrate on the insulating layer,
wherein the insulating layer has a thickness greater than or equal to about 1,000 Å and less than or equal to about 6,000 Å.

13. The method according to claim 11, wherein the heating temperature is basically greater than the glass transition temperature of the base layer.

14. The method according to claim 11, wherein material of the base layer comprises flexible resin material.

15. The method according to claim 14, wherein the base layer comprises acrylic type resins, the heating temperature is greater than or equal to about 120° C. and less than or equal to about 150° C.; or
the base layer comprises polyethylene terephthalate (PET), the heating temperature is greater than or equal to about 140° C. and less than or equal to about 200° C.; or
the base layer comprises polyimide, the heating temperature is greater than or equal to about 180° C. and less than or equal to about 230° C.

16. The method according to claim 11, wherein the base layer has a thickness greater than or equal to about 1 μm and less than or equal to about 5 μm; or the second electrode has a thickness greater than or equal to about 500 Å and less than or equal to about 1,000 Å.

17. The method according to claim 11, wherein material of the first electrode comprises at least one of indium tin oxide (ITO), indium zinc oxide (IZO), gold, silver, aluminum, platinum, palladium, aluminum-doped zinc oxide, or fluorine-doped tin oxide.

18. The method according to claim 17, wherein the first electrode comprises ITO or IZO, the first electrode has a thickness greater than or equal to about 500 Å and less than or equal to about 2,000 Å; or the first electrode comprises silver or aluminum, the first electrode has a thickness greater than or equal to about 500 Å and less than or equal to about 1,000 Å.

* * * * *